United States Patent [19]
Chang et al.

[11] Patent Number: 5,670,397
[45] Date of Patent: Sep. 23, 1997

[54] DUAL POLY-GATE DEEP SUBMICRON CMOS WITH BURIED CONTACT TECHNOLOGY

[75] Inventors: Yih-Jau Chang; Shye-Lin Wu, both of Hsinchu, Taiwan

[73] Assignee: Powerchip Semiconductor Corp., Hsinchu, Taiwan

[21] Appl. No.: 783,754

[22] Filed: Jan. 16, 1997

[51] Int. Cl.$^6$ ................................................ H01L 21/8238
[52] U.S. Cl. .......................... 437/34; 437/41 RC; 437/57; 437/162; 437/238
[58] Field of Search .................. 437/34, 56, 57, 437/58, 59, 41 RCM, 162, 40 R, 41 R, 44, 29, 238

[56] References Cited

U.S. PATENT DOCUMENTS

| | | | |
|---|---|---|---|
| 4,069,067 | 1/1978 | Ichinohe | 437/41 R |
| 4,325,169 | 4/1982 | Ponder et al. | 437/34 |
| 4,694,565 | 9/1987 | Custode | 437/34 |
| 5,270,233 | 12/1993 | Hamatake | 437/57 |
| 5,347,161 | 9/1994 | Wu et al. | 257/756 |
| 5,521,106 | 5/1996 | Okabe | 437/34 |
| 5,612,239 | 3/1997 | Lin et al. | 437/44 |

FOREIGN PATENT DOCUMENTS

| 56-42372 | 4/1981 | Japan | 437/162 |
|---|---|---|---|

OTHER PUBLICATIONS

T. Hamma et al., "A Selective SiO$_2$ Film–Formation Technology Using Liquid–Phase Deposition for Fully Planarized Multilevel Interconnections", *J. Electrochem. Soc.*, vol. 140, No. 8, Aug. 1993, pp. 2410–2414.

Stanley Wolf, *Silicon Processing for the VLSI Era*, vol. 2–*Process Integration*, (Lattice Press, 1990), pp. 160–164.

S.L. Wu et al., "Suppression of Boron Penetration into an Ultra–Thin Gate Oxide ($\geq$7nm) by Using a Stacked–Amorphous–Silicon (SAS) Film," *International Electron Devices Meeting Technical Digest*, (1993), pp. 329–332.

*Primary Examiner*—Michael Trinh
*Attorney, Agent, or Firm*—Christensen O'Connor Johnson & Kindness

[57] ABSTRACT

A CMOS device with buried contacts is formed using a polysilicon stack layer and twin-well and liquid phase deposition (LPD) processes. A gate oxide layer and a first polysilicon layer are formed on a substrate. Then the gate oxide and first polysilicon layer are etched to form gate structures. A polysilicon stack layer is formed on the gate structures. The polysilicon stack layer and the first polysilicon layer are anisotropically dry etched, forming first trenches that expose portions of the gate oxide and portions of the substrate defining S/D regions for a NMOSFET. A NMOS lightly doped drain (LDD) with halo doping profile is implanted. A first LPD oxide is selectively formed in the first trenches. Subsequently, a first heavy ion implantation is performed into the polysilicon stack layer for forming the source, drain, gate and buried contacts of the NMOSFET. Trenches are formed in the polysilicon stack layer and first polysilicon layer to define S/D regions and buried contacts for a PMOSFET. A PMOS LDD with halo doping profile is implanted. A second LPD oxide is selectively formed in the second trenches. A second heavy ion implantation is performed into the polysilicon stack layer to form the source, drain, gate and buried contacts of the PMOSFET. A thermal treatment is used to condense the LPD oxide and to activate the S/D implants and diffuse the heavy implants from the polysilicon stack layer into the substrate to form the buried contacts.

21 Claims, 6 Drawing Sheets

DUAL POLY-GATE DEEP SUBMICRON CMOS WITH BURIED CONTACT TECHNOLOGY

FIELD OF THE INVENTION

The present invention relates to semiconductor devices, and more specifically, to complementary metal-oxide-semiconductor (CMOS) devices with buried contacts.

BACKGROUND

When silicon-gate technology was developed, a means had to be provided for making contact between the polysilicon layer and the silicon substrate. In silicon-gate MOS circuits, such contacts are generally made by using a metal link to interconnect the polysilicon and the substrate, or by buried contacts. The buried contacts have become a standard structure in n-channel metal-oxide-semiconductor (NMOS) integrated circuits (ICs).

In conventional buried contact technology, direct contact is made between a polysilicon layer and a substrate, eliminating the need for a metal link to form the contact. In this structure, a window is opened in the thin gate oxide layer over the substrate area at which the contact is to be established. Subsequently, a polysilicon layer is deposited on the contact so that the polysilicon layer is directly contacting the substrate through the contact window and the polysilicon layer is isolated by the gate oxide and the field oxides. Typically, an ohmic contact is formed at the polysilicon layer and the substrate interface by the diffusion into the substrate of dopant present in the polysilicon. This diffusion, in effect, merges the two silicon regions (i.e., the polysilicon layer and the substrate). Then an insulator layer is formed to cover the contact. The structure is called a "buried contact" because a metal layer can cross over the area of the substrate where a contact has been created without making an electrical connection with this contact. The advantage of the buried contact is that it provides an additional level of interconnect on the ICs.

Unfortunately, there are some problems in implementing the buried contact technology in CMOS. For example, one such problem is phosphorus outdiffusion, which limits device isolation and buried contact design rule scaling. In the conventional buried contact process, the gate oxide must be patterned before the polysilicon layer is deposited, which will adversely impact yield if the oxide is scaled to 25 nm and below (see "*Silicon Processing for the VLSI Era*, vol. 2, pp. 160–164", S. Wolf).

SUMMARY

In accordance with the present invention, a deep submicron CMOS device with a buried contact is provided. In one embodiment, a N-well and a P-well are created in a substrate using suitable conventional processes such as twin-well or retrograded well process. Then field oxide (FOX) regions, a gate oxide and polysilicon gate structures over the N-well and P-well are formed in a conventional manner.

Then, a stack of at least two lightly n type doped polysilicon sublayers is formed on the substrate and the gate structures. This polysilicon stack layer is used to suppress boron penetration into the gate oxide.

A photoresist layer is then formed on the polysilicon stack layer, and then patterned so that trenches are formed in the photoresist layer to define: (i) a narrower polysilicon gate from the P-well polysilicon gate structure, and (ii) buried contact regions in the P-well. Then a dry etching process is used to etch the unmasked portion of the polysilicon stack layer and the P-well polysilicon gate structure. A lightly doped drain (LDD) with halo doping profile is implanted to form the n-channel MOS field effect transistor (NMOSFET). The trenches are then partially filled with oxide formed in a liquid phase deposition (LPD) process. Then the photoresist is stripped away, leaving the LPD oxide intact.

Next, another photoresist is formed and patterned so that a photoresist mask covers the N-well. Subsequently, a heavy $As^+$ ion implantation is performed for doping the source, drain and gate of the NMOSFET and forming the buried contact. More specifically, this implant is performed so that the upper portions of the LPD oxide and the polysilicon stack layer are doped. The dopant, in a later thermal step, then diffuses to form the buried contact and dope the source, drain and gate of the NMOSFET.

The N-well photoresist mask is then removed and another photoresist layer is formed over both the N-well and P-well. The p-channel MOSFET (PMOSFET) with buried contacts is then formed, in a manner similar to forming the NMOSFET, by implanting phosphorus and $BF_2^+$ dopants and partially filling trenches in this photoresist layer with LPD oxide.

Then, a thermal treatment is used to condense the LPD oxide and to drive in the source/drain (S/D) implants and diffuse the heavy implants into the substrate to form the buried contacts. Because the heavy implants diffuse through the polysilicon stack layer, dopant outdiffusion into the gate oxide is suppressed. Then a refractory metal layer is sputtered on the stacked layer and the LPD oxide. Another thermal treatment is used to react the metal layer with the polysilicon stack layer to form a thin silicide layer on formed on the polysilicon stack layer. The metal layer formed on the LPD oxide layer then removed by wet etching.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
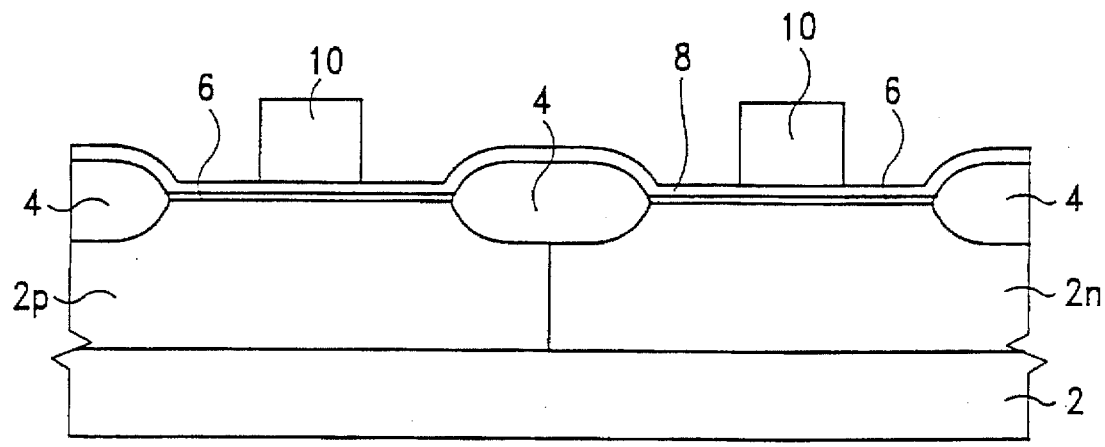
FIG. 1 is a cross sectional view of a semiconductor wafer illustrating the step of forming a gate oxide and a first polysilicon layer on a semiconductor substrate.

Referring to FIG. 1, a single crystal substrate 2 with a <100> crystallographic orientation is used for the preferred embodiment. In this embodiment, a standard twin-well process or retrograded-well process is used in forming the CMOS device. More specifically, for twin-well process a N-well 2n and a P-well 2p are created in the substrate 2 via conventional photoresist masking and ion implantation technologies. Then thick field oxide (FOX) regions 4 are created for the purposes of isolation. Typically, the FOX regions 4 region are created via photolithography and dry etching steps to etch a silicon nitride-silicon dioxide composite layer. After the photoresist is removed and wet cleaned, the silicon nitride layer is typically removed using hot phosphoric acid while the silicon dioxide is removed by using HF. Then thermal oxidation in an oxygen ambient is performed to form the FOX regions 4, to a thickness of about 3000-8000 angstroms. Conversely, for retrograded-well process, field oxide is formed first and then n-well and p-well are formed by ion implantation with photomasking, respectively.

Subsequently, a first oxide layer 6 is formed on the substrate 2 to use as a gate oxide. In the preferred embodiment, the gate oxide layer is composed of silicon dioxide that is formed by using an oxygen-steam ambient, at a temperature between about 800° to 1100° C. Alternatively, the gate oxide 6 may be formed using other known oxide chemical compositions and procedures. For example, the gate oxide layer 6 can be silicon dioxide formed using a chemical vapor deposition (CVD) process, with a tetraethyl orthosilicate (TEOS) source, at a temperature between about 600° to 800° C. and a pressure of about 0.1 to 10 torr. In the preferred embodiment, the thickness of the gate oxide layer 6 is about 30-200 angstroms.

Still referring to FIG. 1, after the gate oxide layer 6 is formed, a thin first polysilicon layer 8 is formed over the gate oxide layer 6 and the FOX regions 4. In this preferred embodiment, the first polysilicon layer 8 is formed using a conventional CVD process to have a thickness of about 100-500 angstroms. Then, a first photoresist 10 is patterned on the substrate 2 to define the gate regions.

Figure 2:
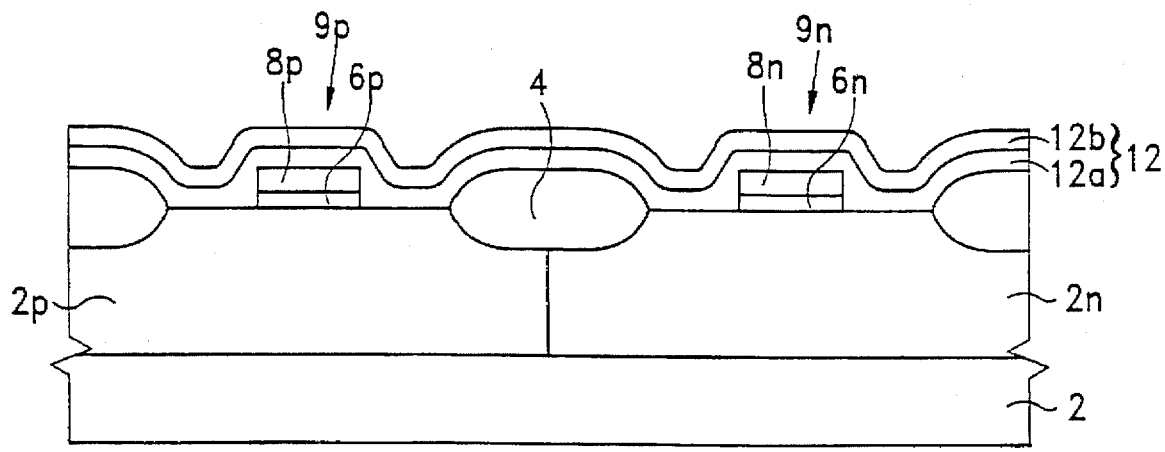
FIG. 2 is a cross sectional view of a semiconductor wafer illustrating the step of forming gate structures and a polysilicon stack layer on the semiconductor substrate.

Now referring to FIG. 2, an etching process, using the first photoresist 10 as a mask, is performed to etch the first polysilicon layer 8 and the gate oxide layer 6 to form a gate structure 9p consisting of residual polysilicon layer 8p and residual gate oxide layer 6p over the P-well 2p. In addition, this etching process forms a gate structure 9n consisting of residual polysilicon layer 8n and residual gate oxide layer 6n over the N-well 2n. After the gate structures are formed, the first photoresist 10 is stripped away. In this embodiment, a standard etch process is used to anisotropically etch the first polysilicon layer 8 and the gate oxide layer 6.

A polysilicon stack layers 12 (or stacked amorphous silicon layer) is then formed on the gate structures, the FOX regions 4 and the substrate 2. In the preferred embodiment, the polysilicon stack layers 12 is formed by conventional conformal deposition of two lightly n doped polysilicon layers 12a and 12b over the substrate 2. The layers 12a and 12b each have a thickness about 200–2000 angstroms. In this embodiment, the polysilicon layers 12a and 12b are doped with arsenic dopants to a concentration of about 1E18 atoms/cm$^3$. Alternatively, the polysilicon stack layers 12 can be implemented with three undoped polysilicon layers, each having a thickness of about 100–1000 angstroms.

The polysilicon stack layers 12 serve to suppress dopant penetration into gate oxide 6p during subsequent processing steps. The stacked polysilicon structures suppress dopant penetration because dopant segregation occurs at the polysilicon stack layer boundaries and the stacked structures provide a longer diffusion path to the polysilicon/silicon dioxide interface. The mechanisms for suppressing dopant penetration into the gate oxide layer 6p are more fully described in the following references: [1] U.S. Pat. No. 5,347,161 entitled "Stacked-layer Structure Polysilicon Emitter Contacted P-N Junction Diode", by S. L. Wu et al; [2] "Suppression of Boron Penetration into an Ultra-Thin Gate Oxide ($\leq 7$ nm) by Using a Stacked-Amorphous-Silicon (SAS) Film", by S. L. Wu et al, IEDM Tech. Dig., p.329, 1993.

Figure 3:
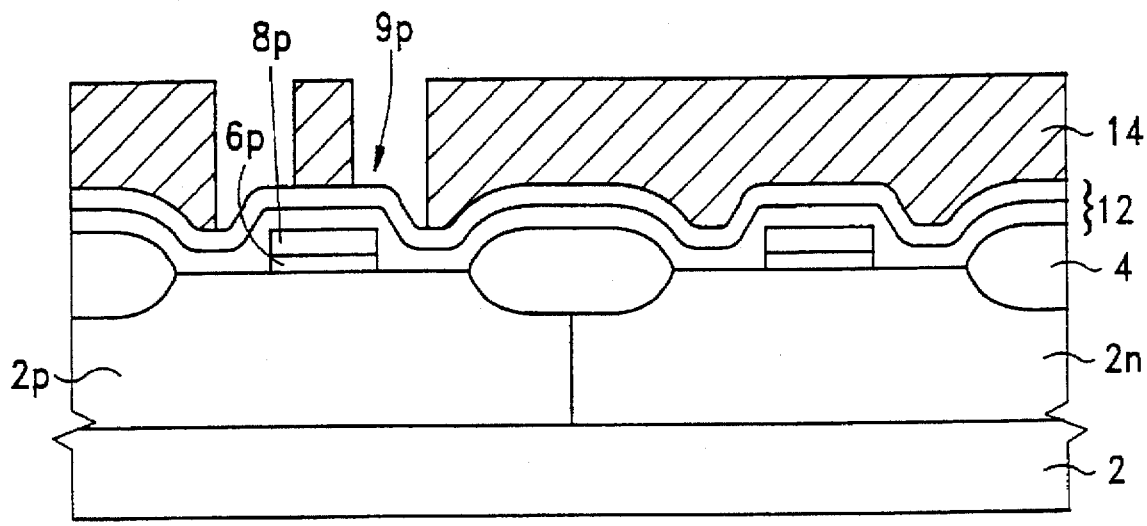
FIG. 3 is a cross sectional view of a semiconductor wafer illustrating the step of etching the polysilicon stack layer to define buried contact regions.

Turning next to FIG. 3, a second photoresist 14 is formed on the polysilicon stack layers 12. The second photoresist is then patterned to define S/D regions, buried contact regions adjacent to the S/D regions in the P-well 2p and a stacked polysilicon gate 13 on the P-well 2p for the NMOSFET. The stacked polysilicon gate 13 is sized to be narrower in width than the gate structure 9p. Then a standard dry etching process is used to etch the unmasked portions of the polysilicon stack layers 12. In this embodiment, the etchant used to etch the polysilicon stack layers 12 is $Cl_2$, $BCl_3/CCl_4$, $CF_4$, but in other embodiments, any suitable etchant selected such as, for example, $SiCl_4/Cl_2$, $HBr/O_2/Cl_2$, $SF_6$, $SF_6/Br_2$, $HBr/O_2$, $BCl_3/Cl_2$ can be used. This etching process preferably is highly selective for polysilicon over oxide and crystalline silicon, which allows the etching process to remove the polysilicon while leaving the gate oxide and the substrate intact. Because the stacked polysilicon gate 13 is narrower than the gate structure 9p, this etching process exposes small portions 15 of the gate oxide 6p, which extend about 1000–5000 angstroms on either side of the stacked polysilicon gate 13.

Figure 4:
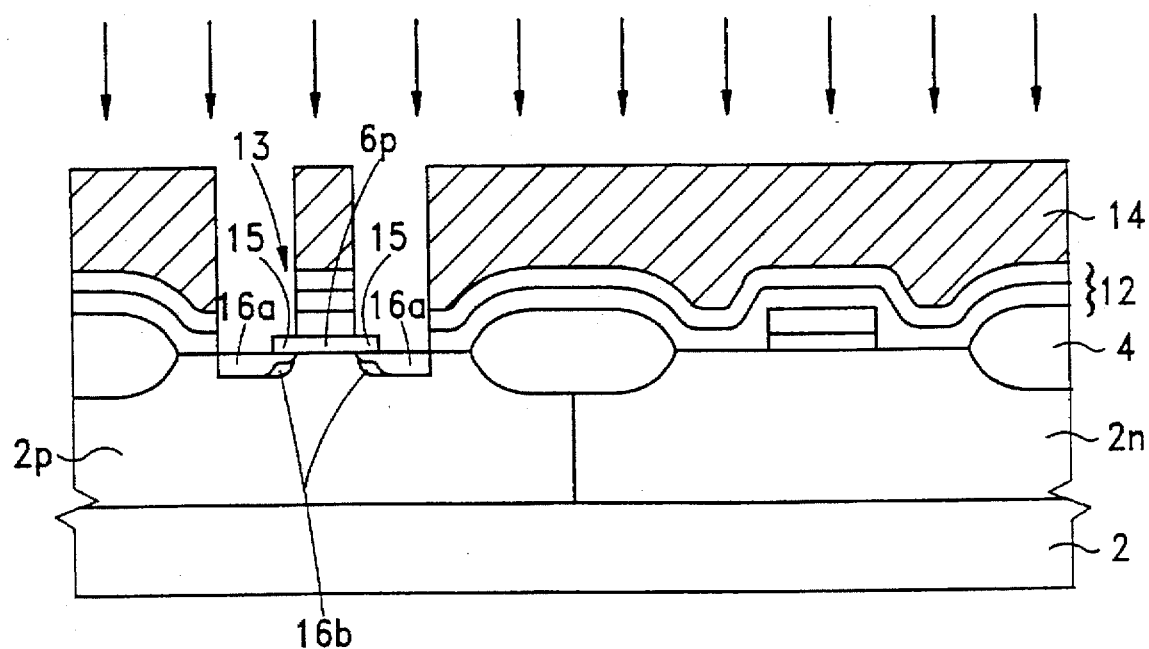
FIG. 4 is a cross sectional view of a semiconductor wafer illustrating the step of forming a LDD with halo doping profile of a NMOS device.

Turning next to FIG. 4, a lightly doped drain (LDD) 16a with halo doping profile 16b is formed in a conventional manner to form the NMOS device. In the preferred embodiment, boron is used as the dopant for the p$^-$ halo profile 16b. The boron is implanted with an implant energy of about 10–50 KeV and a dose of about 1E12–1E14 ions/cm$^2$. Then arsenic is implanted into the substrate 2 to form the n$^-$ LDD region 16a using a dose of about 1E10–1E13 ions/cm$^2$ and an implant energy of about 10–50 KeV. The portions 15 of the gate oxide serve to form the relatively shallow doped region of the LDD doping profile near the gate.

Figure 5:
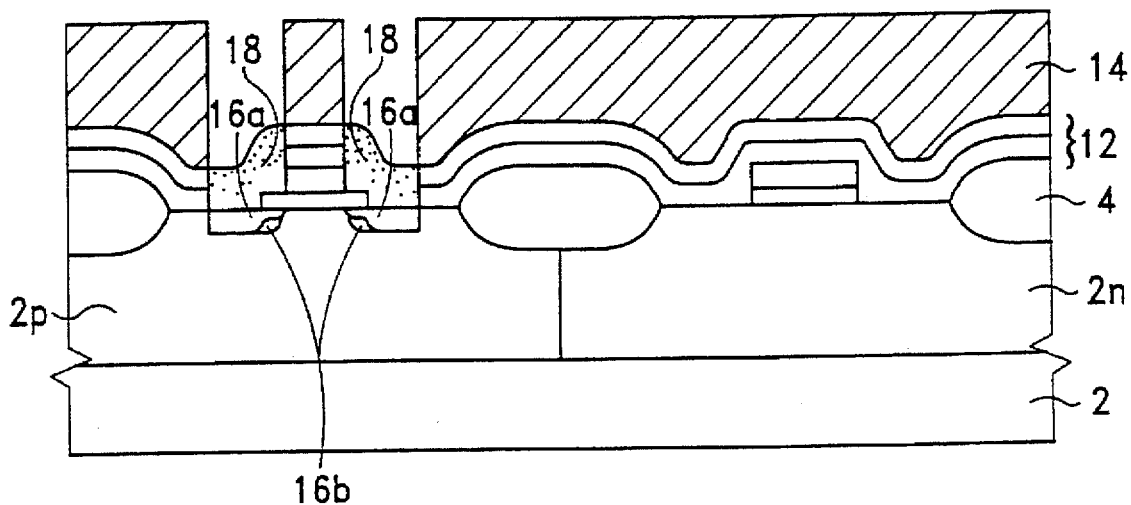
FIG. 5 is a cross sectional view of a semiconductor wafer illustrating the step of forming a first LPD oxide in the trenches between photoresist patterns.

Turning to FIG. 5, the removed portions of the photoresist 14 used to define the source/drain regions and the trenched regions are then partially filled with oxide 18 using a liquid phase deposition (LPD) process. The LPD oxide 18 can be selectively formed in the trenches between photoresist masks. In this embodiment, the LPD process is performed at room temperature using supersaturated hydrofluosilicic acid ($H_2SiF_6$) aqueous solution as a source liquid to form silicon dioxide and hydrofluoric acid (HF), with boric acid ($H_3BO_3$)

to consume the hydrofluoric acid. This low temperature process is used advantageously to keep the photoresist intact. Equations 1 and 2 below describe the reactions.

  (1)

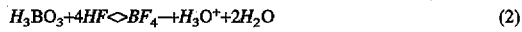  (2)

Figure 6:
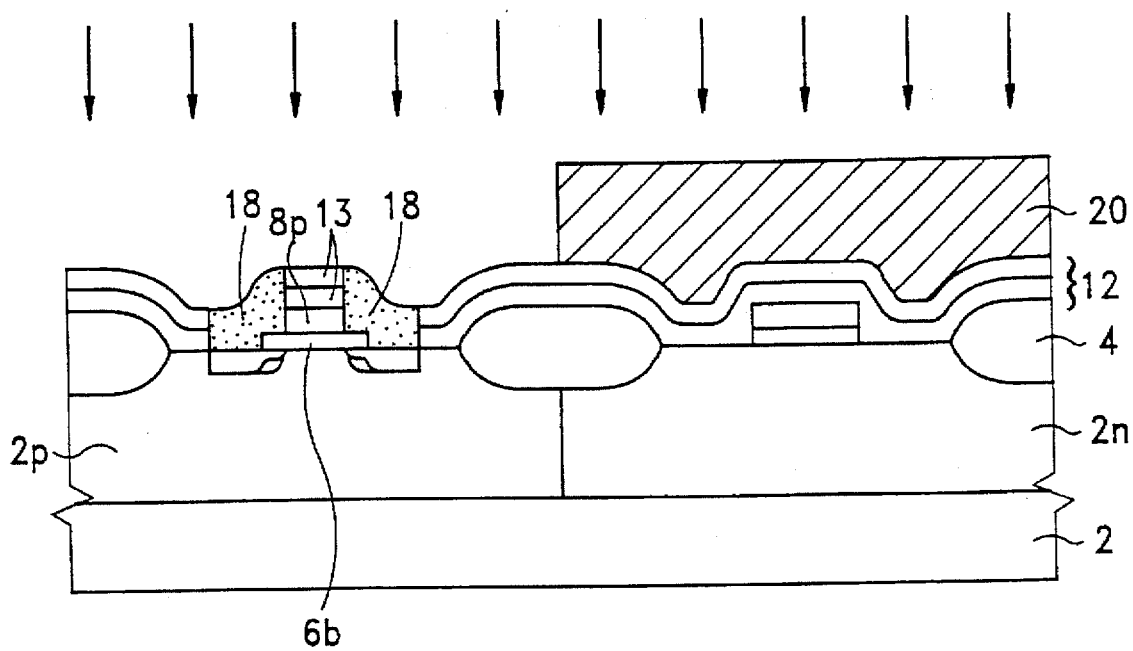
FIG. 6 is a cross sectional view of a semiconductor wafer illustrating the step of forming the source, drain and the gate of the NMOS.

Next, referring to FIG. 6, the photoresist 14 is stripped away and a third photoresist 20 is patterned on the N-well 2n. Subsequently, a heavy arsenic (As$^+$) ion implantation is carried out using the photoresist 20 as a mask. The heavy As$^+$ implant is controlled to be in upper portions of the polysilicon stack layers 12, the LPD oxide 18, and the stacked polysilicon gate 13. These implanted portions are used for doping the source, drain and gate of the NMOSFET and for forming the buried contact. More specifically, a subsequent thermal process is used to diffuse the As$^+$ dopants through the polysilicon. The polysilicon stack layers 12 on top of the polysilicon layer 8p suppress dopant diffusion into the gate oxide 6p as described above. On the other hand, the portions of the polysilicon stack layers 12 contacting the substrate can diffuse As$^+$ dopants into the substrate to form the buried contacts. The As$^+$ dopants do not readily diffuse through the LPD oxide 18, thereby preventing As$^+$ dopant diffusion into the gate oxide. In this embodiment, the energy of the implantation is about 30–200 KeV while the dose is in the range of about 2E15–2E16 ions/cm$^2$. Alternatively, phosphorus (P$^+$) dopants can be implanted using an implant energy of about 20–70 KeV and a dose of about 2E15–2E16 ions/cm$^2$. The photoresist 20 is removed after the ion implantation is completed.

Figure 7:
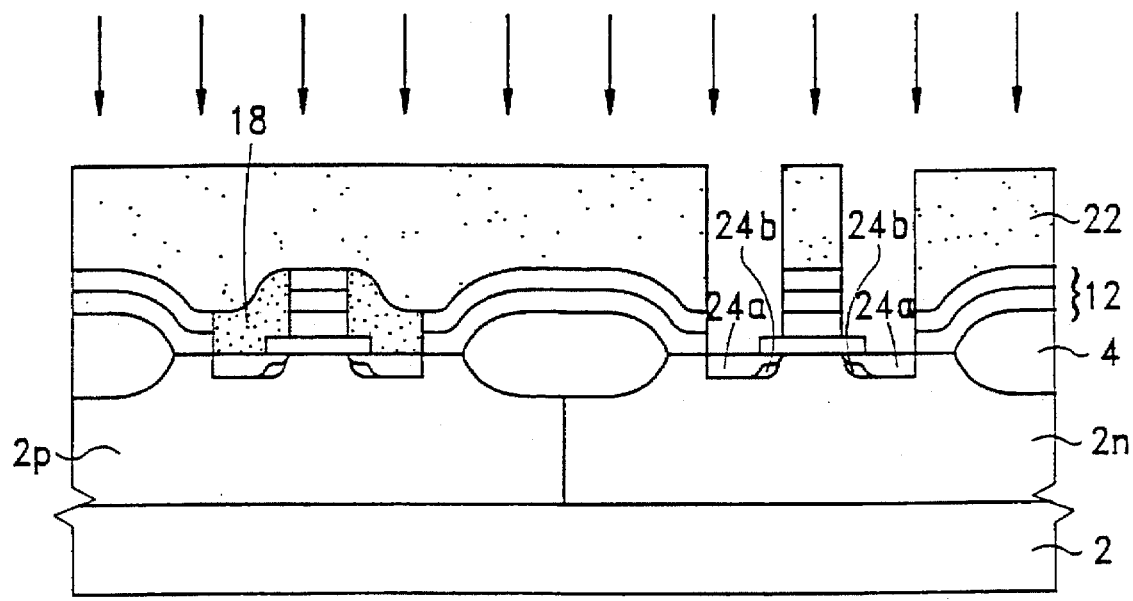
FIG. 7 is a cross sectional view of a semiconductor wafer illustrating the step of forming LDD with halo doping profile of a PMOS device.
Figure 8:
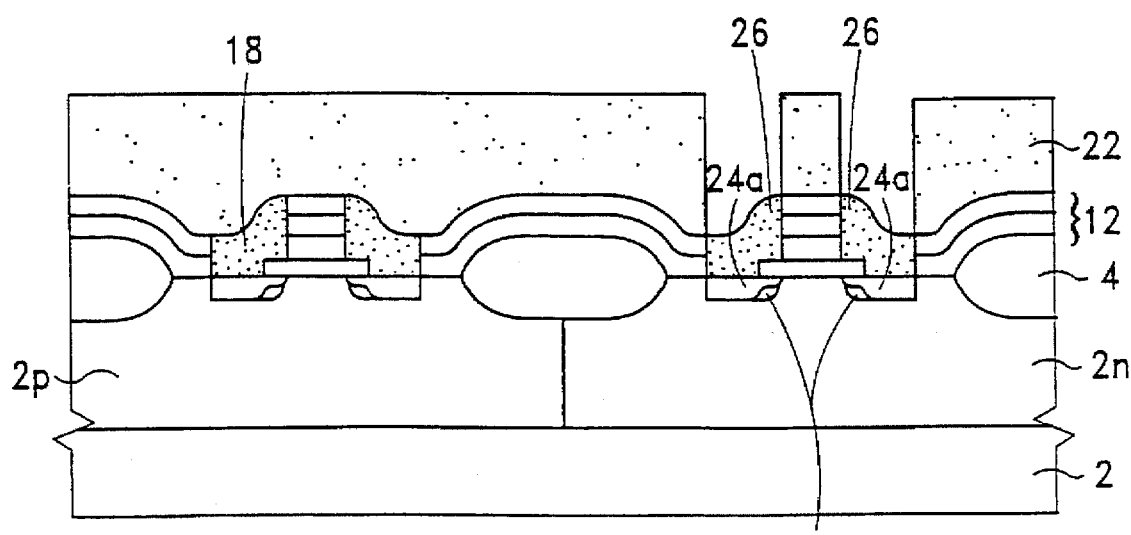
FIG. 8 is a cross sectional view of a semiconductor wafer illustrating the step of forming a second LPD oxide in the trenches between photoresist patterns.
Figure 9:
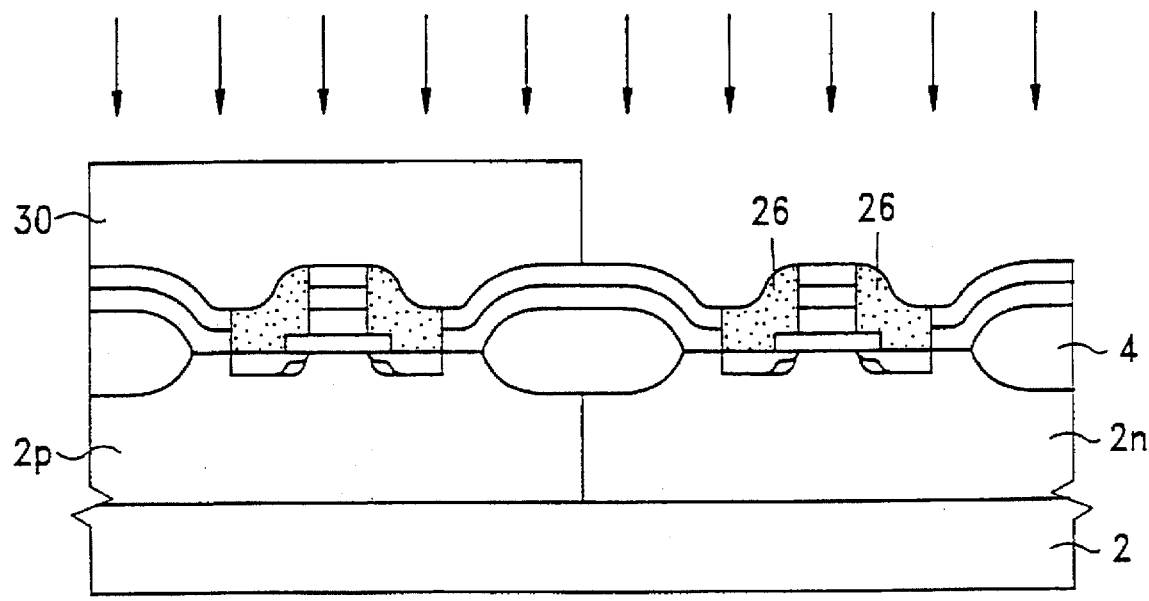
FIG. 9 is a cross sectional view of a semiconductor wafer illustrating the step of forming the source, drain and the gate of the PMOS.

Referring to FIG. 7–9, a PMOSFET is formed in a manner substantially identical to the formation of the NMOSFET described above in conjunction with FIGS. 3–6 (except for the dopants). More specifically, as shown in FIG. 7, a fourth photoresist 22 is patterned on the substrate to define the stacked polysilicon gate, the S/D regions and the buried contact regions of the PMOSFET. A high selectivity dry etching process is utilized to form trenches through portions of the polysilicon stack layers 12 over the N-well 2n, thereby forming the stacked polysilicon gate with portions of the gate oxide extending beyond the sidewalls of the stacked polysilicon gate. In addition, these trenches expose a portion of the substrate for forming the S/D regions for the PMOSFET, while leaving intact portions of the polysilicon stack layers 12 contacting the substrate for forming buried contacts adjacent to the S/D regions. A LDD 24a with halo doping profile 24b is then implanted in the using the fourth photoresist 22 as an implant mask. In this embodiment, phosphorus is used as the dopant to form the n- halo profile 24b. The phosphorus is implanted with an energy of about 10–50 KeV and a dose of about 1E10–1E13 ions/cm$^2$. Then BF$_2^+$ is implanted to form the LDD 24a, using a dose of about 1E12–1E14 ions/cm$^2$ and an implant energy of about 10–50 KeV.

Referring to FIG. 8, a second LPD oxide 26 is subsequently formed in the trenches in the photoresist 22 at room temperature. Then the photoresist 22 is stripped away.

As shown in FIG. 9, a fifth photoresist 30 is patterned to cover the P-well 2p and to expose the N-well 2n. The fifth photoresist 30 is used as an implant mask for a heavy ion implantation of BF$_2^+$ of the upper portions of the polysilicon stack layers 12. This BF$_2^+$ implant is used for doping, by diffusion, the gate and S/D regions, and for forming buried contacts. In this embodiment, the dose of the implantation is about 2E15–2E16 ions/cm$^2$ while the energy of the implantation is about 20–80 KeV. Then the fifth photoresist 30 is stripped away.

Figure 10:
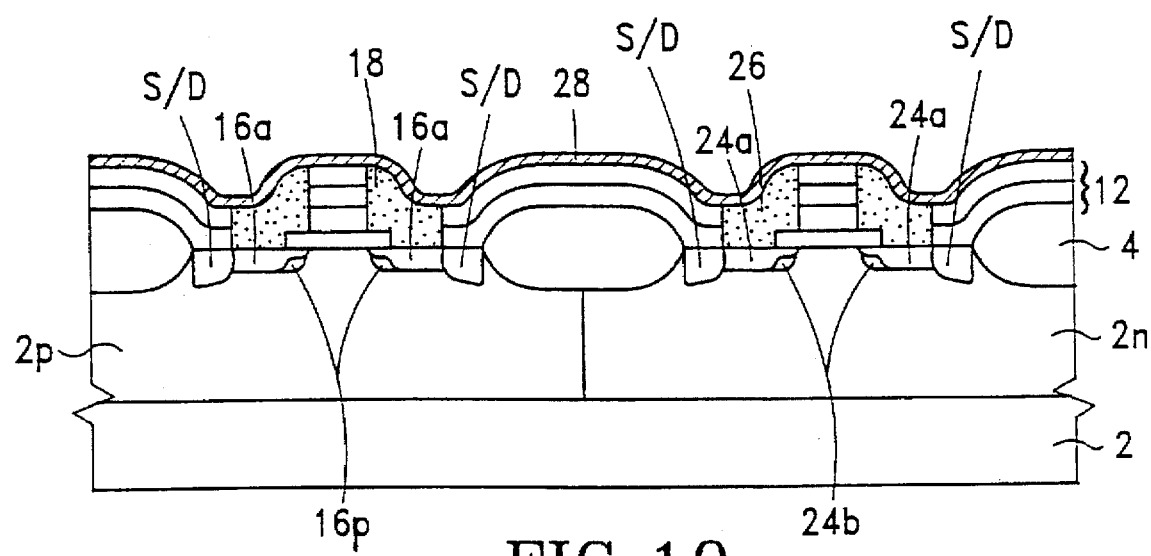
FIG. 10 is a cross sectional view of a semiconductor wafer illustrating the step of performing a thermal treatment to condense the first and second LPD oxide, and to drive in the S/D implants and diffuse the heavy implants in the polysilicon stack layer into the substrate.

Turning next to FIG. 10, a thermal treatment is performed to condense the LPD oxide 18 and 26 and to activate the S/D implants. In addition, this thermal treatment diffuses the heavy implants in the polysilicon stack layers 12 into the substrate 2 to form the buried contacts and ultra-shallow junctions. This thermal treatment is performed in an oxygen ambient at a temperature about 700°–1000° C. Then a refractory metal layer 28, such as Ti, Co, W etc., is sputtered on the polysilicon stack layers 12 and the LPD oxide 18 and 26. In this embodiment, the metal layer 28 has a thickness of about 200–2000 angstroms.

Figure 11:
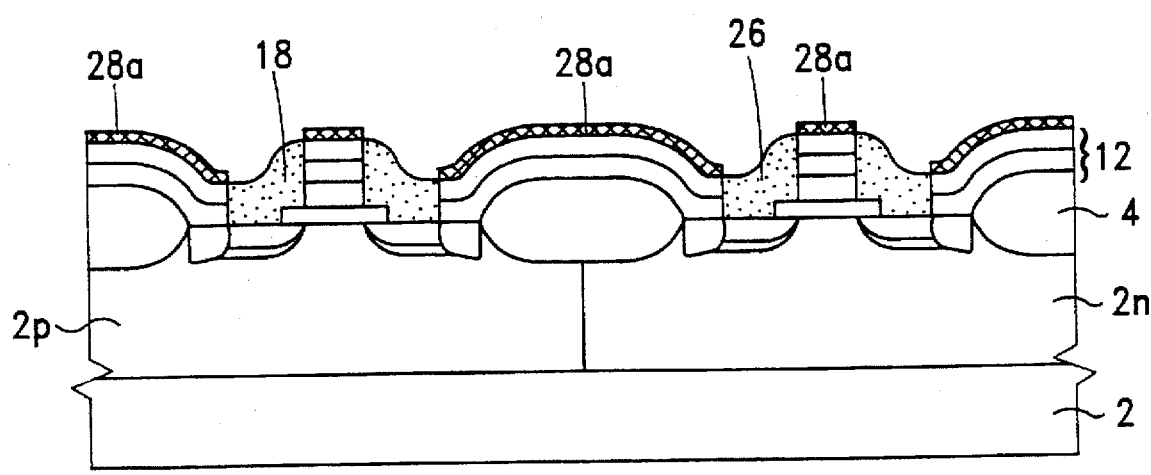
FIG. 11 is a cross sectional view of a semiconductor wafer illustrating the step of forming a silicide layer on the polysilicon stack layer.

Turning to FIG. 11, a standard two-step silicidation process is performed. In this embodiment, a rapid thermal annealing (RTA) at a temperature of about 600° C. for Ti or about 450° C. for Co is used to react the metal layer 28 with the polysilicon stack layers 12 to form a thin silicide layer 28a on the polysilicon stack layers 12. Then the unreacted metal is removed from the oxide using a standard wet etching process. A second RTA process is performed to transform the silicide's phase to a less resistive phase. For Ti silicide, this second RTA has a temperature of about 750°–850° C. For Co silicide, the second RTA has a temperature of about 800°–900° C.

As can be appreciated from the above disclosure, the present invention provides the following advantages: (1) the buried contact technology can be easily implemented in CMOS ultra large scale integration (ULSI) fabrication processes; (2) ultra-shallow junction structures can be obtained and the dopant outdiffusion, especially for boron and fluorine in a dual poly-Si gate, is suppressed through the stacked-Si process; and (3) a smooth topography of gate to S/D can be achieved through the use of LPD oxide.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a CMOS device on a semiconductor substrate, the method comprising:

forming a first conductivity well and second conductivity well in said substrate;

forming a gate oxide layer on said substrate;

forming a first polysilicon layer over said gate oxide layer;

patterning a first photoresist on said first polysilicon layer;

etching said gate oxide layer and said first polysilicon layer using said first photoresist as a mask, wherein residual portions of said first polysilicon layer form a gate structure over said first conductivity well and a gate structure over said second conductivity well;

removing said first photoresist;

forming polysilicon stack layers on said substrate and said first polysilicon layer;

patterning a second photoresist on said polysilicon stack layers to define source and drain (S/D) regions and buried contact regions in said first conductivity well;

etching said polysilicon stack layers and said first polysilicon layer using said second photoresist as a mask to form first trenches in said polysilicon stack layers and said first polysilicon layer, said trenches exposing portions of said substrate and portions of said gate oxide over said first conductivity well;

doping portions of said substrate aligned with said first trenches to have a second conductivity lightly doped drain (LDD) with halo doping profile;

forming a first dielectric layer using a liquid phase deposition (LPD) process, wherein said first dielectric layer fills said first trenches in said polysilicon stack layer;

removing said second photoresist;

patterning a third photoresist on said polysilicon stack layers to cover said second conductivity well;

performing a first ion implantation using said third photoresist as a mask to implant ions into portions of said polysilicon stack layers over said first conductivity well;

stripping said third photoresist;

patterning a fourth photoresist on said polysilicon stack layers to define S/D regions and buried contact regions in said second conductivity well;

etching said polysilicon stack layers and said first polysilicon layer by using said fourth photoresist as an etching mask to form second trenches in said polysilicon stack layers and said first polysilicon layer, said second trenches exposing portions of said substrate and portions of said gate oxide over said second conductivity well;

doping portions of said substrate aligned with said second trenches to have a first conductivity LDD with halo doping profile;

forming a second dielectric layer using said LPD process, wherein said second dielectric layer fills said second trenches in said polysilicon stack layers;

stripping said fourth photoresist;

patterning a fifth photoresist on said polysilicon stack layers to cover said first conductivity well;

performing an second ion implantation by using said fifth photoresist as a mask to implant ions into portions of said polysilicon stack layers over said second conductivity well;

stripping said fifth photoresist; and thermally treating said first and second dielectric layers and said substrate, wherein dopants from said first and second ion implantations diffuse into said substrate to form buried contacts.

2. The method of claim 1, further comprising forming a metal layer on said polysilicon stack layers and said first and second dielectric layers and reacting said metal layer with said polysilicon stack layers to form a silicide layer on said polysilicon stack layers.

3. The method of claim 1, wherein said polysilicon stack layers comprise at least two doped polysilicon sublayers.

4. The method of claim 1, wherein said polysilicon stack layers comprise at least three undoped polysilicon sublayers.

5. The method of claim 3, wherein said polysilicon sublayers comprise tightly doped polysilicon having a dopant concentration of about 1E18 ions/cm$^3$.

6. The method of claim 5, wherein said polysilicon sublayers each have a thickness of about 200–2000 angstroms.

7. The method of claim 1, wherein said first conductivity well is a P-well and said second conductivity well is a N-well.

8. The method of claim 7, wherein doping portions of said substrate aligned with said first trenches to have a second conductivity LDD with halo doping profile comprises:

implanting a first conductivity dopant to form a halo region; and implanting a second conductivity dopant to form a second conductivity LDD region.

9. The method of claim 8, wherein said first conductivity dopant comprises boron.

10. The method of claim 9, wherein said first conductivity dopant is implanted using an implant energy of about 10–50 KeV and a dose of about 1E12–1E14 ions/cm$^2$.

11. The method of claim 8, wherein said second conductivity dopant comprises arsenic.

12. The method of claim 11, wherein said second conductivity dopant is implanted using an implant energy of about 10–50 KeV and a dose of about 1E10–1E13 ions/cm$^2$.

13. The method of claim 7, wherein doping portions of said substrate aligned with said second trenches to have a first conductivity LDD with halo doping profile comprises:

implanting boron dopant to form a halo region; and implanting a first conductivity dopant to form a first conductivity LDD region.

14. The method of claim 13, wherein said first conductivity dopant to form a first conductivity LDD region comprises arsenic.

15. The method of claim 14, wherein said arsenic is implanted using an implant energy of about 10–50 KeV and a dose of about 1E10–1E14 ions/cm$^2$.

16. The method of claim 7, wherein said first ion implantation implants As$^+$ dopants using an implantation energy of about 1000–1500 KeV and a dose of about 3E12–3E13 ions/cm$^2$.

17. The method of claim 7, wherein said second ion implantation implants boron dopants using an implantation energy of about 500–1000 KeV and a dose of about 3E12–3E13 ions/cm$^2$.

18. The method of claim 1, wherein said first and second dielectric layers are LPD oxide layers formed at room temperature.

19. The method of claim 1, wherein said exposed portions of said gate oxide layers extend about 1000–5000 angstroms from each side wall of said first polysilicon layer.

20. The method of claim 1, wherein etching said gate oxide layer and said first polysilicon layer is performed using an anisotropic etching process.

21. The method of claim 1, wherein said first and second trenches are formed using an anisotropic dry etching process with an etchant selected from the goup consisting of $Cl_2$, $BCl_3/CCl_4$,$CF_4$, $SiCl_4/Cl_2$, $HBr/O_2/Cl_2$, $SF_6$, $SF_6/Br_2$, $HBr/O_2$, and $BCl_3/Cl_2$.

* * * * *